(12) United States Patent
Rhee et al.

(10) Patent No.: US 8,446,190 B2
(45) Date of Patent: May 21, 2013

(54) FREQUENCY DIVIDER, FREQUENCY SYNTHESIZER AND APPLICATION CIRCUIT

(75) Inventors: Woogeun Rhee, Beijing (CN); Xueyi Yu, Beijing (CN); Yuanfeng Sun, Beijing (CN); Sang-Soo Ko, Suwon-si (KR); Byeong-Ha Park, Seongnam-si (KR); Hyung-Ki Ahn, Seoul (KR); Woo-Seung Choo, Suwon-si (KR); Zhihua Wang, Beijing (CN)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/499,978

(22) Filed: Jul. 9, 2009

(65) Prior Publication Data

US 2010/0225361 A1      Sep. 9, 2010

(30) Foreign Application Priority Data

Mar. 4, 2009  (KR) .................. 10-2009-0018606

(51) Int. Cl.
  *H03L 7/06*   (2006.01)
(52) U.S. Cl.
  USPC ........................ 327/155; 327/117; 327/146
(58) Field of Classification Search
  USPC .............. 327/141, 144–163; 331/1 A, 15–17; 375/373–376
  See application file for complete search history.

(56) References Cited

U.S. PATENT DOCUMENTS

| | | | | |
|---|---|---|---|---|
| 4,888,564 A | * | 12/1989 | Ishigaki | 331/1 A |
| 5,216,587 A | * | 6/1993 | Miyazaki et al. | 363/56.02 |
| 5,550,515 A | * | 8/1996 | Liang et al. | 331/11 |
| 6,008,703 A | * | 12/1999 | Perrott et al. | 332/100 |
| 7,636,020 B1 | * | 12/2009 | Hwang | 331/16 |
| 2001/0022537 A1 | | 9/2001 | Melava et al. | |
| 2002/0136341 A1 | * | 9/2002 | Huh et al. | 375/376 |
| 2002/0140512 A1 | | 10/2002 | Stockton | |
| 2004/0179641 A1 | * | 9/2004 | Mack et al. | 375/376 |
| 2006/0202768 A1 | * | 9/2006 | Puma et al. | 331/16 |
| 2007/0252654 A1 | * | 11/2007 | Beyer et al. | 331/16 |
| 2008/0278243 A1 | * | 11/2008 | Wang et al. | 331/16 |

* cited by examiner

*Primary Examiner* — Lincoln Donovan
*Assistant Examiner* — Brandon S Cole
(74) *Attorney, Agent, or Firm* — Volentine & Whitt, PLLC

(57) ABSTRACT

A frequency divider includes a prescaler and multiple modulus dividers commonly coupled to the prescaler. The prescaler generates intermediate frequency signals having a same phase difference with respect to one another in response to an oscillation frequency signal. The prescaler operates at a first frequency. The modulus dividers respectively divide the intermediate frequency signals with respective ratio to provide a plurality of division frequency signals in response to a control signal. The modulus dividers operate at a second frequency less than the first frequency.

12 Claims, 15 Drawing Sheets

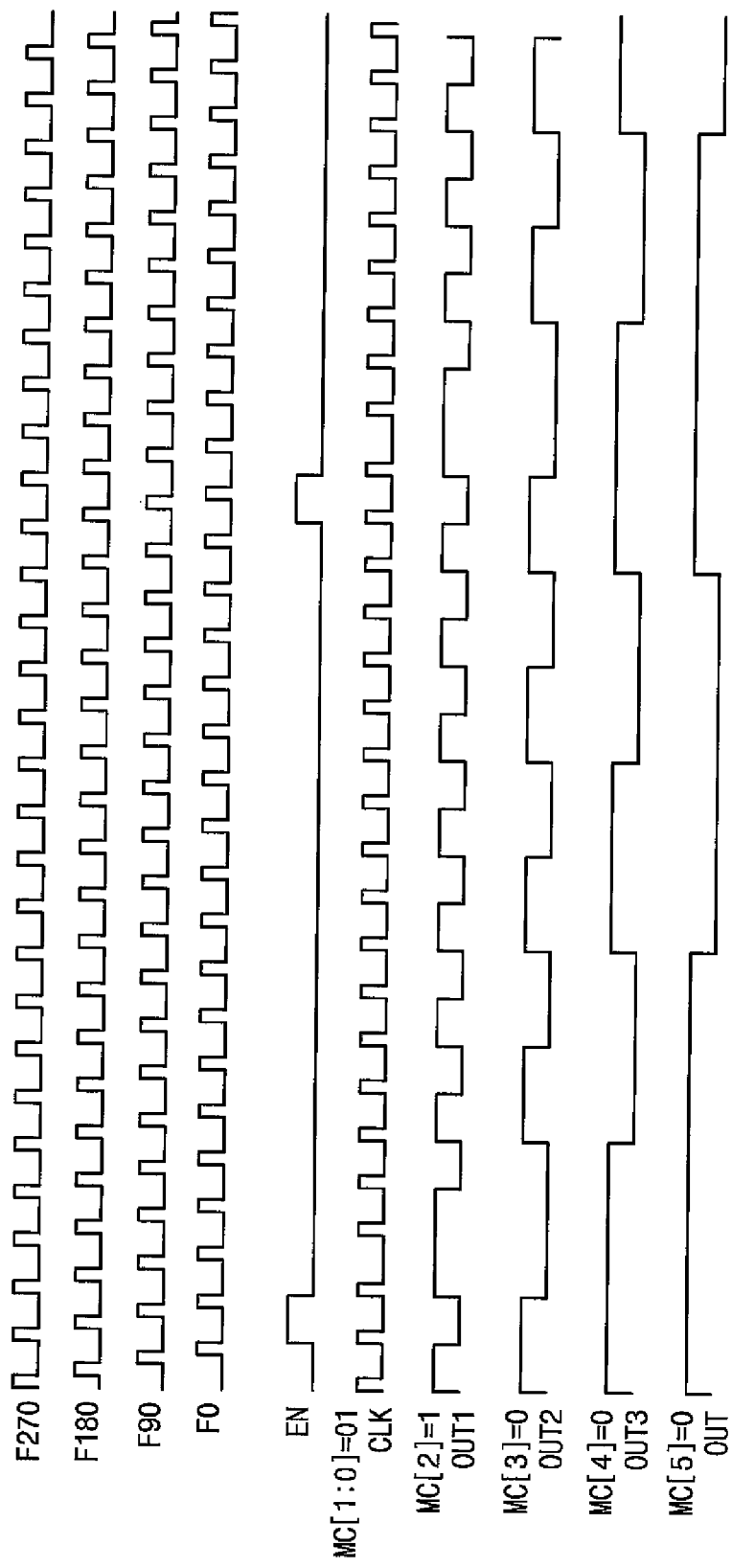

FREQUENCY DIVIDER, FREQUENCY SYNTHESIZER AND APPLICATION CIRCUIT

PRIORITY STATEMENT

This application claims priority under 35 U.S.C. §119 to Korean Patent Application No. 2009-0018606 filed on Mar. 4, 2009, the subject matter of which is hereby incorporated by reference.

BACKGROUND

Example embodiments relate to frequency synthesizing, and more particularly to a frequency divider, a frequency synthesizer including the frequency divider, and an application circuit including the frequency synthesizer.

Phase-locked loop (PLL) circuits are widely used to synthesize a desired signal frequency. PLL frequency synthesizers typically employ an integer-N technique and a fractional-N technique. The integer-N technique uses a fixed integer N to divide an output frequency, and the fractional-N technique uses a number N to divide the output frequency which is selected among two or more integers (e.g., N is varied between two or more integers such that the average value of N is fractional). As a result, a divisor is fractional when using the fractional-N technique due to interpolation of each number N selected for each dividing operation.

It may be difficult to meet certain specifications when employing the integer-N technique due to a trade-off between loop bandwidth and channel spacing. The fractional-N technique alleviates such design restrictions on PLLs permitting a broader loop bandwidth while maintaining narrow channel intervals.

However, the fractional-N technique results in the generation of fractional spurs. In order to reduce the occurrence of fractional spurs, a frequency synthesizer incorporating a sigma/delta modulator has been employed. However, frequency synthesizers incorporating sigma/delta modulators suffer from the generation of so-called sigma/delta noise (e.g., a quantization noise).

SUMMARY

Example embodiments provide a frequency divider capable of reducing power consumption and circuit size. Example embodiments provide a frequency synthesizer capable of reducing power consumption, circuit size and sigma-delta modulation noise. Example embodiments provide an application circuit including the frequency synthesizer.

According to one embodiment, a frequency divider comprises; a prescaler configured to generate a plurality of intermediate frequency signals having a same phase difference with respect to one another in response to an oscillation frequency signal, the prescaler operating at a first frequency; and a plurality of modulus dividers commonly coupled to the prescaler and configured to respectively divide the plurality of intermediate frequency signals by respective ratios to provide a plurality of division frequency signals in response to a control signal, the plurality of modulus dividers operating at a second frequency less than the first frequency.

In a related aspect, the prescaler comprises; a first divider configured to divide the oscillation frequency signal with a fixed first frequency ratio to provide a first plurality of frequency signals having a same phase difference with respect to one another, a logic level converter configured to convert logic levels of the first plurality of frequency signals from a first level to a second level and thereby provide a second plurality of frequency signals having a same phase difference with respect to one another; and an overlap prevention circuit configured to prevent overlap of adjacent frequency signals in the plurality of second frequency signals and provide the plurality of intermediate frequency signals.

The first level may correspond to a current-mode logic level, and the second level may correspond to a CMOS logic level.

In another related aspect, the overlap prevention circuit comprises; a delay cell configured to delay a leading frequency signal of the adjacent frequency signals, and a logic gate configured to perform an AND operation on an inverted version of the leading frequency signal and a lagging frequency signal of the adjacent frequency signals.

In yet another related aspect, each of the plurality of modulus dividers comprises; a phase shifter configured to select one of the plurality of intermediate frequency signals and provide a first clock signal in response to a plurality of phase control bits of the control signal, and a programmable counter configured to divide the first clock signal by a division ratio among a first division range to provide the plurality of division frequency signals in response to a plurality of modulus control bits of the control signal.

In yet another related aspect, the phase shifter comprises; a first selector configured to select one of the plurality of intermediate frequency signals to provide the first clock signal in response to a control word, a second selector configured to select one of the plurality of intermediate frequency signals to provide a second clock signal leading the first clock signal by 90 degrees in phase, in response to the control word, a first register configured to load the control word in synchronization with the first clock signal, a second register configured to buffer the loaded control word in synchronization with the first second signal, and a logic gate configured to determine inputs of the phase control bits as the control word to the first register according to logic level of an enable signal provided from the programmable counter.

In yet another related aspect, the programmable counter comprises; a plurality of second dividers cascaded, coupled, and configured to divide input clock signals including the first clock signal respectively with one of second and third division ratios in response to each of the modulus control bits, the enable signal being enabled once during one cycle of one of the plurality of division frequency signals.

In yet another related aspect, each one of the plurality of modulus dividers comprises; a phase selection unit configured to select one of the plurality of intermediate frequency signals to provide a selection frequency signal in response to a phase control signal, a first divider configured to divide the selection frequency signal with a fixed first division ratio to provide a divided selection frequency signal, a counting unit configured to count the divided selection frequency signal to provide the division frequency signal and divide a counting interval of the divided selection frequency signal to provide a modulus control signal, and a logic gate configured to provide the phase control signal in response to the modulus control signal and the divided selection frequency signal.

According to another embodiment, a frequency synthesizer comprises; a phase-locked loop (PLL) configured to provide an oscillation frequency signal in response to a reference frequency signal and each of plurality of division frequency signals, wherein the PLL comprises a frequency divider having a prescaler, and a plurality of modulus dividers commonly coupled to the prescaler and configured to provide the plurality of division frequency signals, a sigma-delta modulator configured to operate in synchronization with one of the plurality of division frequency signals, and sigma-delta modulate a clock signal and data to provide a modulation signal, and a delay unit configured to delay the modulation signal to provide control signals to the PLL.

In a related aspect, the PLL further comprises; a multiple phase detector configured to provide an up signal and a down signal in response to the reference frequency signal and each of the plurality of division frequency signals, the up signal and the down signal each having a plurality of bits, a multiple charge pump configured to provide a current signal based on the up signal and the down signal, a loop filter configured to filter the current signal to provide a control voltage, and a voltage-controlled oscillator configured to generate the oscillation frequency signal based on the control voltage.

In another related aspect, the prescaler operates at a first frequency and generates a plurality of intermediate frequency signals having a same phase difference with respect to one another in response to an oscillation frequency signal, and the plurality of modulus dividers operates at a second frequency less than the first frequency and each one of the plurality of modulus dividers respectively divides one of the plurality of intermediate frequency signals with a ratio to provide a plurality of division frequency signals in response to a control signal.

According to another embodiment, an application circuit comprises; a data processing unit configured to process baseband data and convert the processed baseband data to an amplitude signal and a phase signal, a frequency synthesizer configured to generate an oscillation frequency signal based on a reference frequency signal and the phase signal, and a power amplifier configured to synthesize the oscillation frequency signal and the amplitude signal to output a transmission signal, wherein the frequency synthesizer comprises a phase-lock loop (PLL) configured to provide the oscillation frequency signal in response to the reference frequency signal and each of a plurality of division frequency signals, the PLL comprising a frequency divider having a prescaler and a plurality of modulus dividers commonly coupled to the prescaler and configured to provide the plurality of division frequency signals.

BRIEF DESCRIPTION OF THE DRAWINGS

Example embodiments will be more clearly understood from the following detailed description made in conjunction with the accompanying drawings.

FIGS. 8A through 8C are related waveform diagrams illustrating the enable signal and output signals according to various phase control bits and the modulus control bits.

DESCRIPTION OF EMBODIMENTS

Various example embodiments will be described more fully with reference to the accompanying drawings. The present invention may, however, be embodied in many different forms and should not be construed as being limited to only the illustrated embodiments. Rather, these embodiments are presented as teaching examples. Throughout the written description and drawings, like reference numbers and labels refer to like or similar elements.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
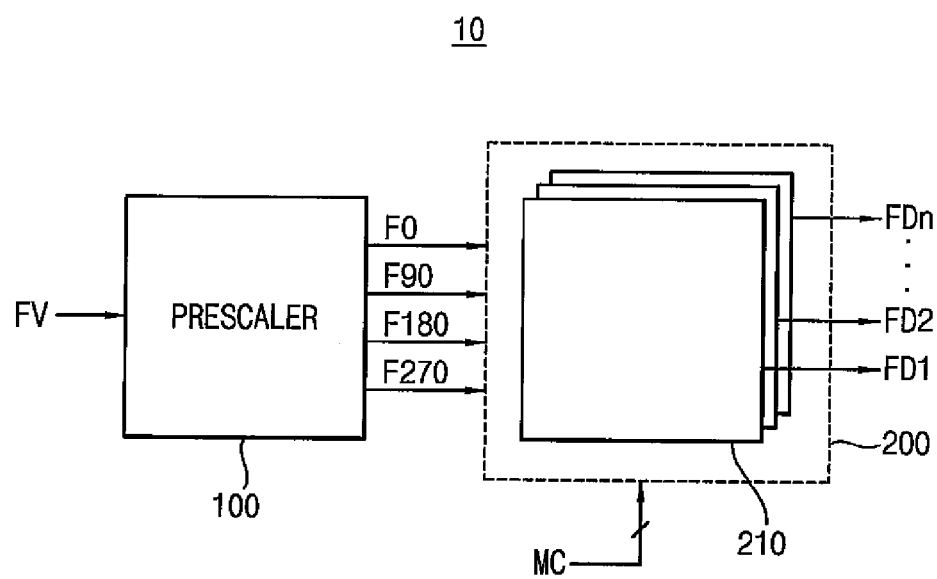
FIG. 1 illustrates a frequency divider according to an example embodiment.

FIG. 1 illustrates a frequency divider according to an example embodiment.

Referring to FIG. 1, a frequency divider 10 includes a prescaler 100 and a plurality of modulus dividers 200.

The prescaler 100 generates a plurality of intermediate frequency signals, for example four intermediate frequency signals F0, F90, F180, and F270 in response to an oscillation frequency signal FV. The oscillation frequency signal FV in the illustrated embodiment may be a single-ended signal or differential signals. In addition, the oscillation frequency signal FV may be a first logic level signal. In addition, the prescaler 100 operates with a frequency of the oscillation frequency signal FV. That is, the prescaler 100 operates with a relatively high frequency, and thus consumes more power.

The intermediate frequency signals F0, F90, F180, and F270 have same phase differences with respect to one another and may be second logic level signals. For example, the intermediate frequency signals F0, F90, F180, and F270 of the illustrated embodiment are assumed to have phase differences of 90 degrees with respect to one another. The first logic level may be current-mode logic (CML) level, and the second logic level may be CMOS logic level.

The modulus dividers 200 are commonly coupled to the prescaler 100, and the modulus dividers 200 respectively divide the intermediate frequency signals F0, F90, F180, and F270 with respective ratios to provide a plurality of division frequency signals FD1, FD2, . . . , FDN in response to a control signal MC.

Figure 2:
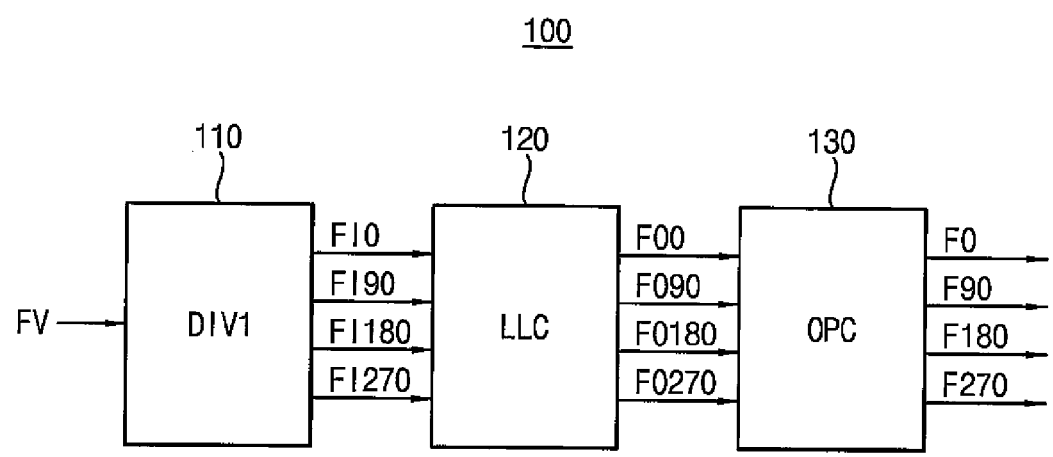
FIG. 2 is a block diagram further illustrating the prescaler of FIG. 1.

FIG. 2 is a block diagram further illustrating the prescaler of FIG. 1.

Referring to FIG. 2, a prescaler 100 includes a first divider 110, a logic level converter (LLC) 120, and an overlap prevention circuit (OPC) 130. The first divider 110 divides the oscillation frequency signal FV with a fixed division ratio, for example four, to provide a first plurality of frequency signals FI0, FI90, FI180, and FI270 having same phase differences with respect to one another. The first frequency signals FI0, FI90, FI180, and FI270 have same phase differences, for example 90 degree, with respect to one another, and may be current-mode logic level signals. The LLC 120 converts logic levels of the first frequency signals FI0, FI90, FI180, and FI270 from CML level to CMOS level to provide a second plurality of frequency signals FO0, FO90, FO180, and FO270. The OPC 130 prevents overlapping of two adjacent signals of the second frequency signals FO0, FO90, FO180, and FO270, for example two signals having 90 degree phase difference, to provide the intermediate frequency signals F0, F90, F180, and F270.

Figure 3:
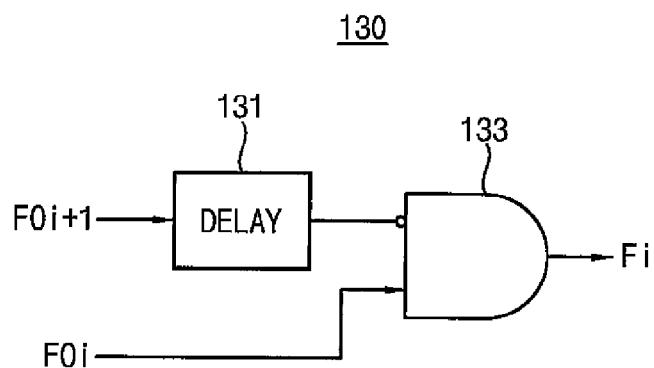
FIG. 3 is a circuit diagram further illustrating the overlap prevention circuit of FIG. 2.

FIG. 3 is a circuit diagram illustrating an overlap prevention circuit (OPC) of FIG. 2.

Referring to FIG. 3, an OPC 130 includes a delay cell 131 and a logic gate 133. The delay cell 131 delays a leading frequency signal FOi+1 of two adjacent frequency signals FOi+1 and FOi of second frequency signals FO0, F090, F0180, and F0270. The logic gate 133 performs an AND operation on an inverted signal of the leading frequency signal FOi+1 and the lagging frequency signal FOi to provide an intermediate frequency signal Fi.

Table 1 below illustrates relationships between the leading frequency signal FOi+1, the lagging frequency signal FOi and the intermediate frequency signal Fi.

TABLE 1

| FOi + 1 | FOi | Fi |
|---------|-------|------|
| FO90    | FO0   | F0   |
| FO180   | FO90  | F90  |
| FO270   | FO180 | F180 |
| FO0     | FO270 | F270 |

Figure 4:
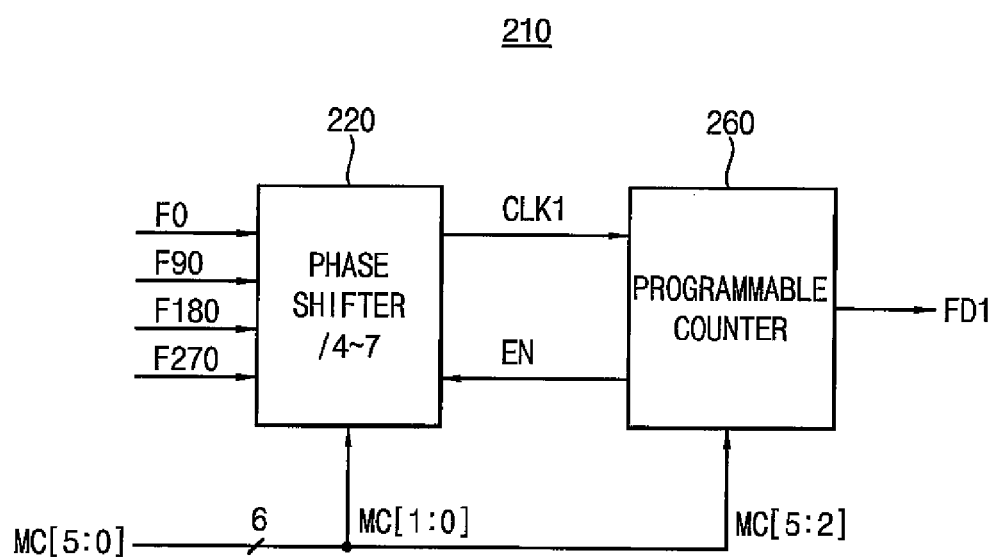
FIG. 4 is a block diagram further illustrating one of the plurality of modulus dividers of FIG. 1.

FIG. 4 is a block diagram illustrating one of the modulus dividers. Other modulus dividers of the modulus dividers 200 of FIG. 1 are assumed to have a similar configuration as a modulus divider 210.

Referring to FIG. 4, the modulus divider 210 includes a phase shifter 220 and a programmable counter 260. Hereinafter, it will be assumed that the control signal MC includes six bits, wherein the lower two bits of the control signal MC are phase control bits, and the upper four bits of the control signal MC are modulus control bits.

The phase shifter 220 selects one of the intermediate frequency signals F0, F90, F180, and F270 to provide a first clock signal CLK1 in response to the phase control bits MC[1:0] of the control signal MC[5:0]. In addition, the phase shifter 220 divides the intermediate frequency signals F0, F90, F180, and F270 with one of the division ratios from four to seven. The programmable counter 260 divides the first clock signal CLK1 to provide the division frequency signal FD1, in response to the modulus control bits MC[5:2].

Figure 5:
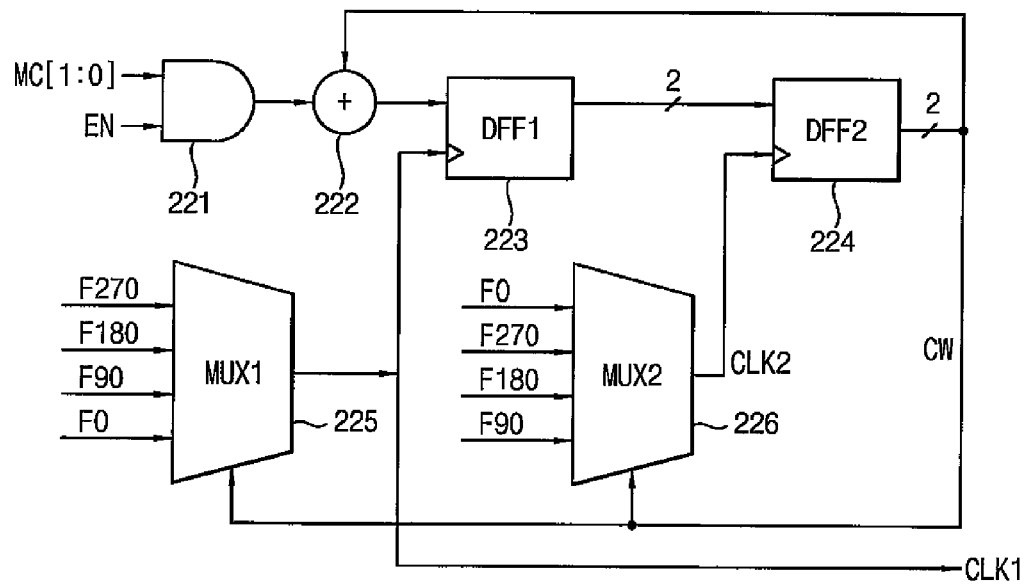
FIG. 5 is a circuit diagram further illustrating the phase shifter of FIG. 4 according to an example embodiment.

FIG. 5 further illustrates the phase shifter of FIG. 4 according to an example embodiment.

Referring to FIG. 5, the phase shifter 220 includes a logic gate 221, an adder 222, a first register 223, a second register 224, a first selector 225, and a second selector 226. The first selector 225 selects one of the intermediate frequency signals F0, F90, F180, and F270 to provide the first clock signal CLK1, in response to a control word CW. The second selector 226 selects one of the intermediate frequency signals F0, F90, F180, and F270 to provide a second clock signal CLK2, in response to the control word CW. The second clock signal CLK2 leads the first clock signal CLK1 in phase by 90 degree. Table 2 below illustrates the first clock signal CLK1, and the second clock signal CLK2 according to the control word CW.

TABLE 2

| CLK1 | CLK2 |
|------|------|
| F270 | F0   |
| F180 | F270 |
| F90  | F180 |
| F0   | F90  |

The first register 223 loads the control word CW in synchronization with the first clock signal CLK1. The second register 224 buffers the control word CW loaded in the first register 223 in synchronization with the second clock signal CLK2. The first and second registers 223 and 224 may be implemented with D flip-flops.

The logic gate 221 determines inputs of the phase control bits MC[1:0] as the control word CW to the first register 223 according to logic level of an enable signal EN provided from the programmable counter 260. When the logic level of the enable signal EN is logic low level, the first register 223 receives an output of the second register 224. When the logic level of enable signal EN is logic low level, the first register 223 receives an output of the adder 222 that adds the phase control bits MC[1:0] and the output of the second register 224.

Table 3 below illustrates an average division ratio of the phase shifter 220 according to the phase control bits MC[1:0].

TABLE 3

| MC[1:0] | Average Division Ratio |
|---|---|
| 00 | 4/4 = 1.00 |
| 01 | 5/4 = 1.25 |
| 10 | 6/4 = 1.50 |
| 11 | 7/4 = 1.75 |

Figure 6:
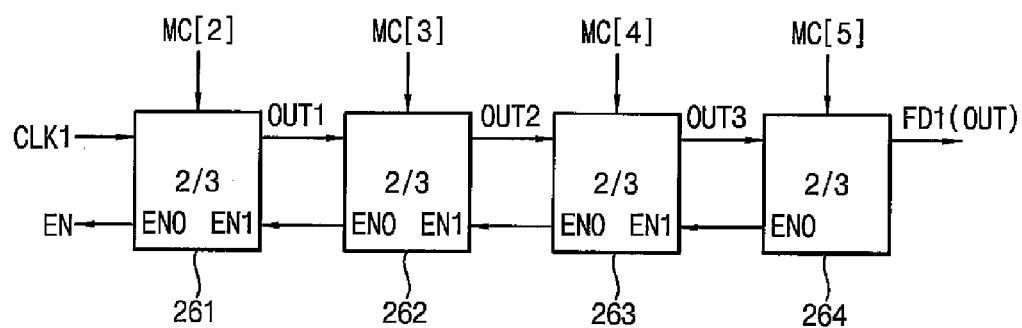
FIG. 6 is a block diagram illustrating a programmable counter of FIG. 4 according to an example embodiment.

FIG. 6 is a block diagram further illustrating the programmable counter of FIG. 4 according to an example embodiment.

Referring to FIG. 6, the programmable counter 260 includes a plurality of dividers 261, 262, 263, and 264 that are cascaded-coupled. The divider 261 receives the first clock signal CLK1 and divides the first clock signal CLK1 with one of division ratios of two and three according to the phase control bits MC[2] to provide an output signal OUT1. The divider 262 receives the output signal OUT1 and divides the output signal OUT1 with one of division ratios of two and three according to the phase control bits MC[3] to provide an output signal OUT2. The divider 263 receives the output signal OUT2 and divides the output signal OUT2 with one of division ratios of two and three according to the phase control bits MC[4] to provide an output signal OUT3. The divider 264 receives the output signal OUT3 and divides the output signal OUT3 with one of division ratios of two and three according to the phase control bits MC[4] to provide the division frequency signal FD1, i.e., an output signal OUT. Here, the division ratios of two and three of the dividers 261, 262, 263, and 264 are merely selected examples and other division ratios are possible.

In addition, an enable output ENO of the divider 264 is connected to an enable input EN1 of the divider 263, an enable output ENO of the divider 263 is connected to an enable input EN1 of the divider 262, an enable output ENO of the divider 262 is connected to an enable input EN1 of the divider 261, and the enable signal EN is provided at an enable output ENO of the divider 261. The enable signal EN is provided to the phase shifter 220 as illustrated with reference to FIG. 5, and the enable signal EN is enabled once during one cycle of the division frequency signal FD1.

Table 4 below illustrates a division ratio of the programmable counter 260 according to the modulus control bits MC[5:2].

TABLE 4

| MC[5:2] | Division Ratio |
|---|---|
| 0000 | 16 |
| 0001 | 17 |
| 0010 | 18 |
| ... | ... |
| 1111 | 31 |

As illustrated in Table 4, when each bit of the modulus control bits MC[5:2] input to the dividers 261, 262, 263, and 264 is logic high level, the dividers 261, 262, 263, and 264 divide the first clock signal CLK1 and the output signals OUT1, OUT2, and OUT3 with the division ratio of three. When each bit of the modulus control bits MC[5:2] input to the dividers 261, 262, 263, and 264 is logic low level, the dividers respectively 261, 262, 263, and 264 divide the first clock signal CLK1 and the output signals OUT1, OUT2, and OUT3 with the division ratio of two.

In another example embodiment, when each bit of the modulus control bits MC[5:2] input to the dividers 261, 262, 263, and 264 is logic high level, the dividers 261, 262, 263, and 264 respectively may divide the first clock signal CLK1 and the output signals OUT1, OUT2, and OUT3 with the division ratio of two, and when each bit of the modulus control bits MC[5:2] input to the dividers 261, 262, 263, and 264 is logic low level, the dividers 261, 262, 263, and 264 may respectively divide the first clock signal CLK1 and the output signals OUT1, OUT2, and OUT3 with the division ratio of three. Therefore, the programmable counter 260 divides the first clock signal with one of division ratio of sixteen to thirty one according to the modulus control bits MC[5:2] to provide the division frequency signal FD1.

Figure 7:
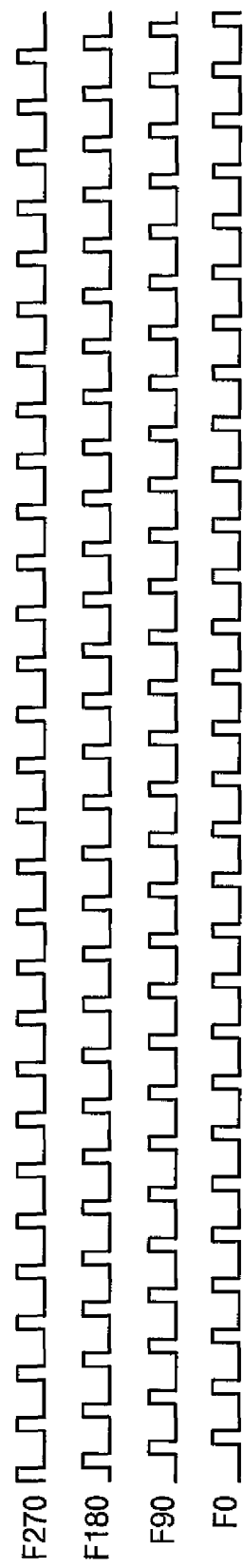
FIG. 7 is a waveform diagram illustrating intermediate frequency signals provided by the prescaler of FIG. 2.

FIG. 7 is a waveform diagram illustrating intermediate frequency signals F0, F90, F180, and F270 provided by the prescaler of FIG. 2.

Referring to FIG. 7, the intermediate frequency signals F0, F90, F180, and F270 have a same frequency, but also have different phase with respect to one another.

Figure 8A:
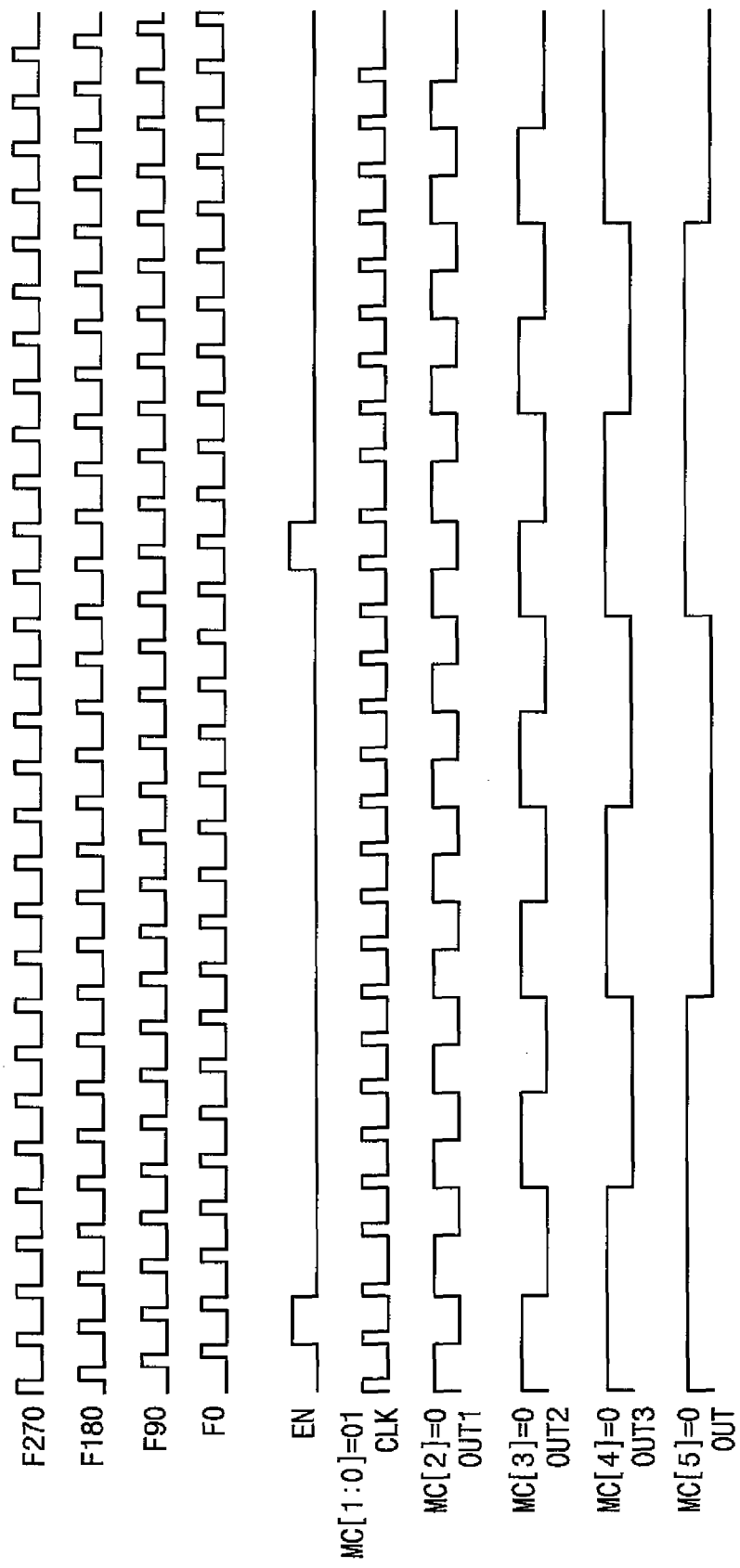
Figure 8C:
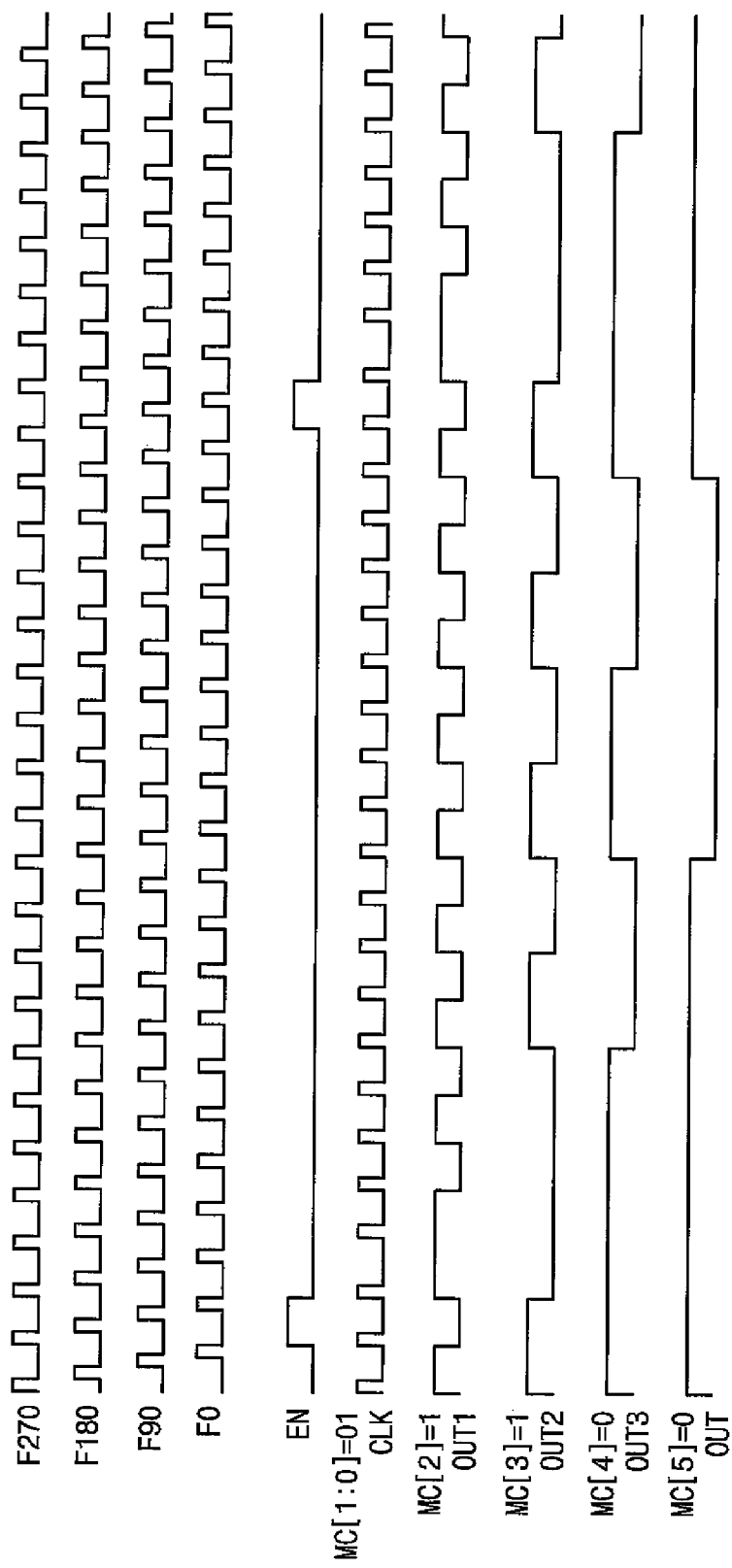

FIGS. 8A through 8C are related waveform diagrams illustrating the enable signal EN and output signals OUT1, OUT2, OUT3, and OUT4 assuming phase control bits MC[1:0] and the modulus control bits MC[5:2].

In FIGS. 8A through 8C, the output signal OUT corresponds to the division frequency signal FD1. In addition, the intermediate frequency signals F0, F90, F180, and F270 are illustrated altogether in FIGS. 8A through 8C for convenience of explanation.

FIG. 8A shows an example in which the phase control bits MC[1:0] is '01' and the modulus control bits MC[5:2] is '0000'. FIG. 8B shows an example in which the phase control bits MC[1:0] is '01' and the modulus control bits MC[5:2] is '0001'. FIG. 8C shows an example in which the phase control bits MC[1:0] is '01' and the modulus control bits MC[5:2] is '0011'.

Referring to FIGS. 8A through 8C, the enable signal EN is enabled once during one cycle of the output signal OUT, i.e., the division frequency signal FD1. In addition, the output signals OUT2 and OUT3 of the dividers 262 and 263 are divided once with the division ratio of three during one cycle of the division frequency signal FD1, because the modulus control bits MC[5:2] input to the dividers 262 and 263 are logic high level.

As illustrated in FIG. 1, the plurality of modulus dividers such as the modulus divider 210 of FIG. 5 are commonly coupled to the prescaler 100 of FIG. 1. In addition, the first divider 110 included in the prescaler 100 has a fixed division ratio, and operates with a frequency of the oscillation frequency signal FV. Therefore, power consumption and circuit size may be reduced.

Figure 9:
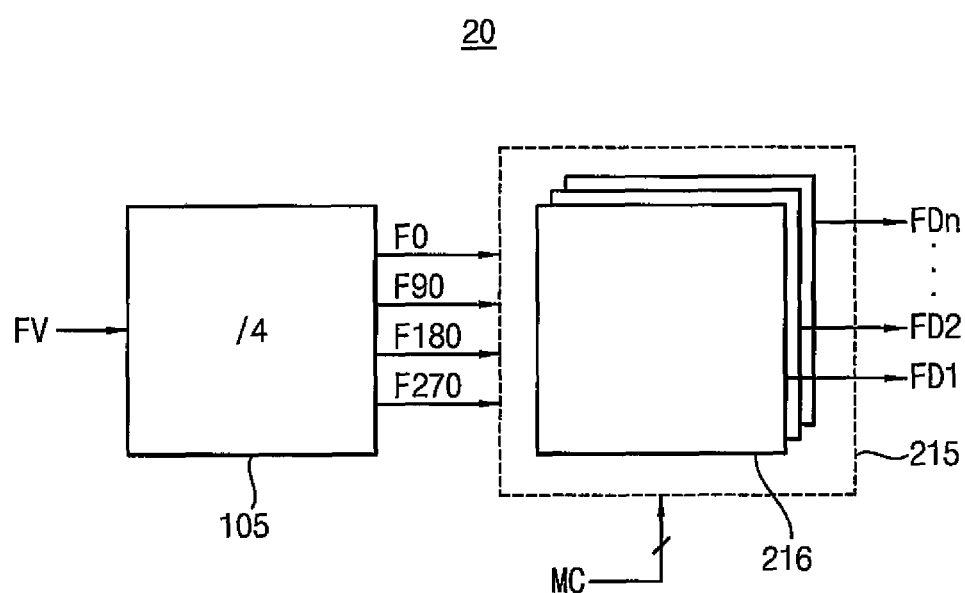
FIG. 9 is a block diagram further illustrating the frequency divider of FIG. 1 according to another example embodiment.

FIG. 9 illustrates a frequency divider of FIG. 1 according to another example embodiment. Referring to FIG. 9, a frequency divider 20 includes a prescaler 105 and a plurality of modulus dividers 215. The prescaler 105 may be implemented with a divider having a fixed division ratio, for example, four.

Figure 10:
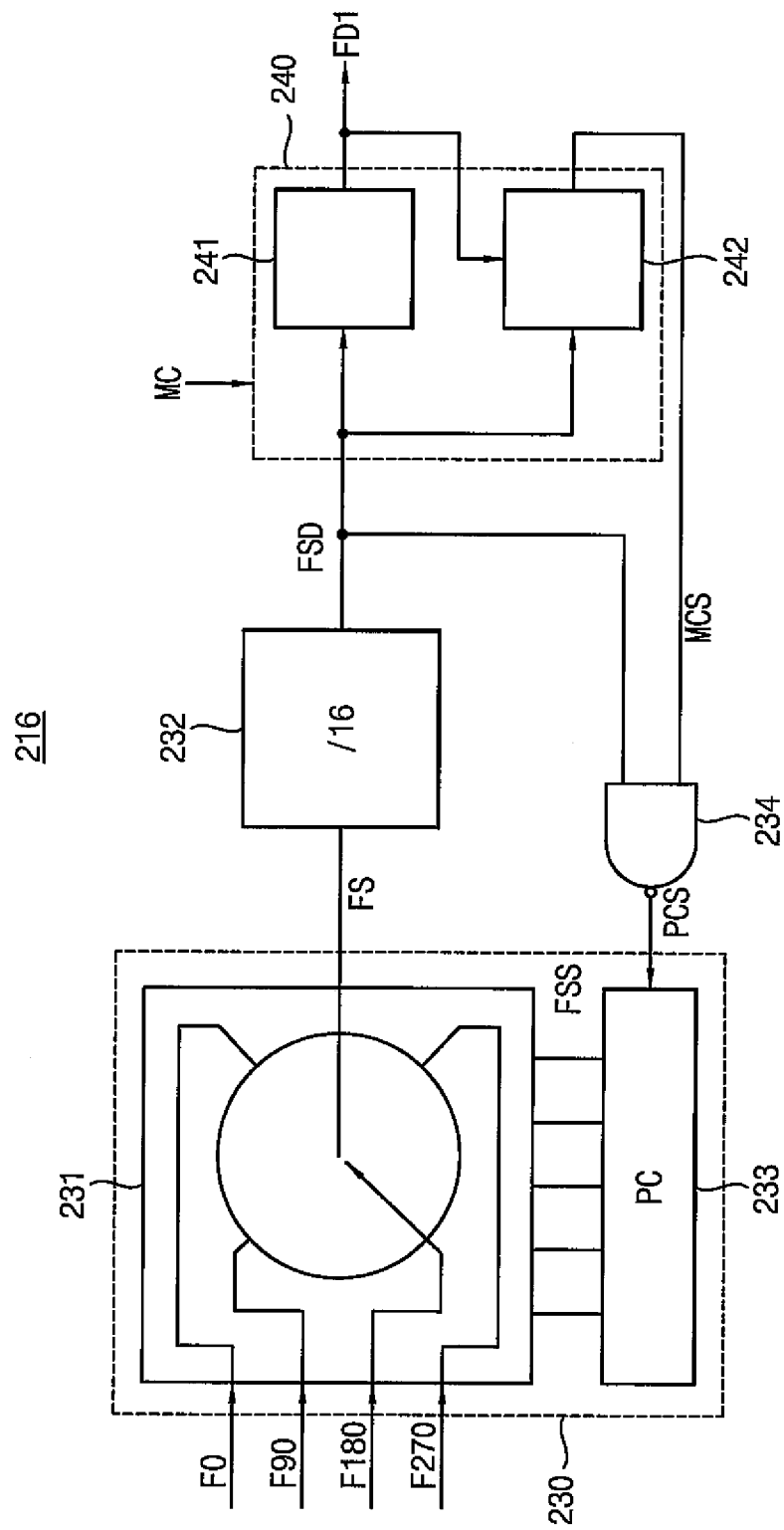
FIG. 10 is a block diagram further illustrating one of the plurality of modulus dividers of FIG. 9.

FIG. 10 is a block diagram further illustrating one of the modulus dividers of FIG. 9.

Referring to FIG. 10, a modulus divider 216 includes a phase selection unit 230, a first divider 232, a counting unit 240 and a logic gate 234. The phase selection unit 230 includes a phase controller 231 and a phase switch 233. The counting unit 240 includes a main counter 241, and a swallow counter 242.

The phase selection unit 230 selects one of the intermediate frequency signals the intermediate frequency signals F0, F90, F180, and F270 to provide a selection frequency signal FS, in response to a phase control signal PCS. The phase switch 231 switches and selects one of the intermediate frequency signals F0, F90, F180, and F270, in response to the frequency selection signal FSS. The first divider 232 divides the selection frequency signal FS with a fixed division ratio, for example sixteen, to provide a divided selection frequency signal FSD.

The counting unit 240 counts the divided selection frequency signal FSD to provide the division frequency signal FD1 and divides a counting interval of the divided selection frequency signal FSD to provide a modulus control signal MCS. The main counter counts the divided selection frequency signal FSD to provide the counting result as the division frequency signal FD1, in response to the control signal MC.

The swallow counter 242 divides the counting interval of the divided selection frequency signal FSD and counts the counting interval with different counting coefficients to provide the modulus control signal MCS, and the swallow counter 242 is reset by the division frequency signal FD1.

The logic gate 231 performs a NAND operation on the modulus control signal MCS and the divided selection frequency signal FSD to provide the phase control signal PCS.

As illustrated in FIG. 1, a plurality of modulus dividers such as the modulus divider 216 of FIG. 10 are commonly coupled to the prescaler 100 of FIG. 1. In addition, the prescaler 105 has a fixed division ratio, and operates with a frequency of the oscillation frequency signal FV. Therefore, power consumption and circuit size may be reduced.

Figure 11:
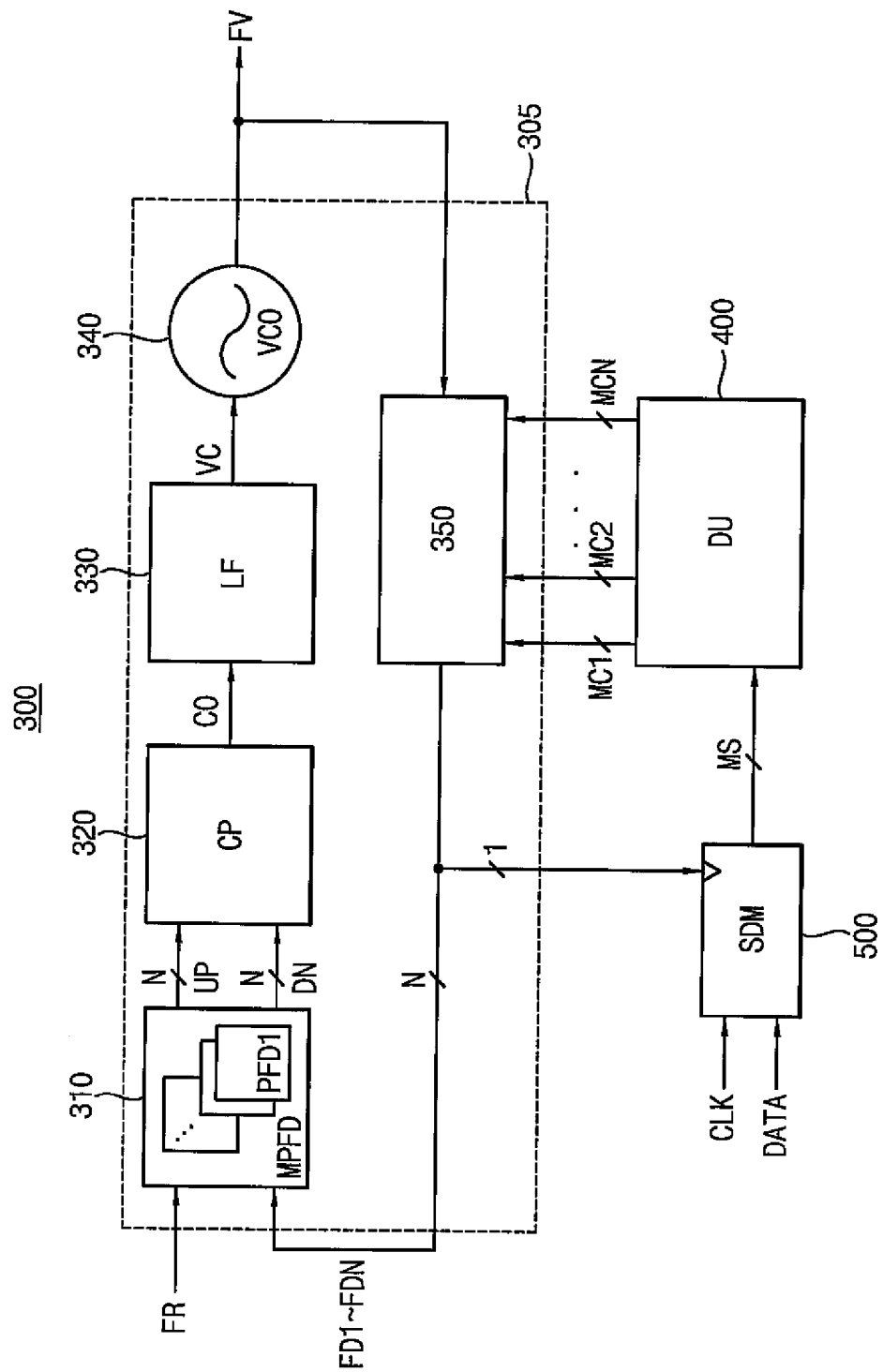
FIG. 11 is a block diagram illustrating a frequency synthesizer according to an example embodiment.

FIG. 11 is a block diagram illustrating a frequency synthesizer according to an example embodiment. Referring to FIG. 11, a frequency synthesizer 300 includes a PLL 305, a delay unit 400, and a sigma-delta modulator.

The PLL 305 generates an oscillation frequency signal FV based on a reference frequency signal FR and each of a plurality of division frequency signals FD1~FDN. The oscillation frequency signal FV may be a single-ended signal, or may be differential signals. The sigma-delta modulator 500 operates in synchronization with one of the division frequency signals FD1 FDN, and sigma-delta modulates a clock signal CLK and data DATA to provide a modulation signal MS.

The delay unit 400 delays the modulation signal MS N times to generate a plurality of control signals MC1~MCN, and applies the generated control signals MC1~MCN to the modulus dividers 200 and 215. The control signals MC1~MCN applied to the modulus dividers 200 go through a multiple phase detector 310 and a multiple charge pump 320. Therefore high frequency components of the modulation signal MS are reduced because high frequency noise components of the modulation signal MS are averaged while the control signals MC1~MCN applied to the modulus dividers 200 go through the multiple phase detector 310 and the multiple charge pump 320.

The PLL 305 includes a multiple phase detector 310, a multiple charge pump 320, a loop filter 330, a voltage-controlled oscillator (VCO) 340 and a frequency divider 350.

The multiple phase detector 310 includes a plurality of phase detectors such as a phase detector PFD1, and compares the reference frequency signal FR and each of the division frequency signals FD1~FDN, to provide a plurality of bits of up signal UP and a plurality of bits of down signal DN based on respective phase difference of the reference frequency signal FR and each of the division frequency signals FD1~FDN. The up signal UP and the down signal DN may be N bits respectively. The multiple charge pump 320 provides a current signal CO based on the up signal UP and the down signal DN. The current signal CO may be a single-ended signal or may be differential signals. Although not illustrated, the multiple charge pump may include a plurality of charge pumps, and each of the charge pumps may receive each bit of the up signal UP and the down signal DN. The loop filter filters the current signal CO to provide a control voltage VC. The control voltage VC may be a single-ended signal or may be differential signals. The VCO 340 generates the oscillation frequency signal FV based on the control voltage VC. That is, the VCO 340 generates the oscillation frequency signal FV proportional to the control voltage VC. The frequency divider 350 receives the oscillation frequency signal FV, and divides the oscillation frequency signal FV with respective division ratios based on the control signals MC1~MCN to provide the division frequency signals FD1~FDN. The VCO 340 may be an LC oscillator.

The frequency synthesizer 350 in the illustrated embodiment employs modulus dividers such as those previously described in relation to FIGS. 1 through 10. Therefore, the frequency divider 350 may include the prescaler 100 of FIG. 1 or the prescaler 105 of FIG. 9 operating with a first frequency and the plurality of modulus dividers 200 or 215 commonly coupled to the one prescaler and operating with a second frequency less than the first frequency.

Figure 12A:
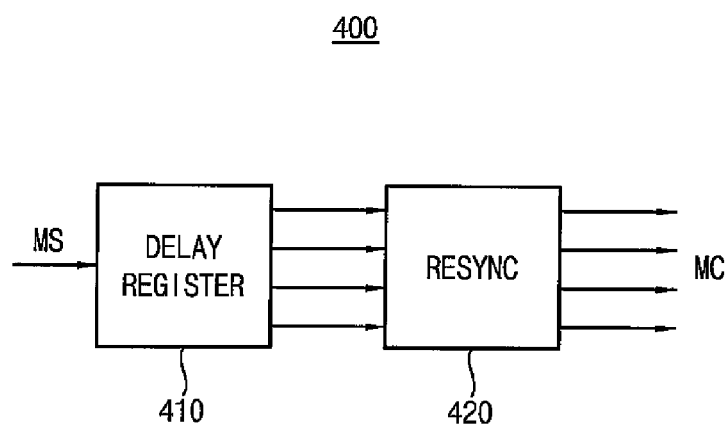
FIG. 12A is a block diagram further illustrating the delay unit of FIG. 11 according to an example embodiment.

FIG. 12A is a block diagram further illustrating the delay unit of FIG. 11 according to an example embodiment. Referring to FIG. 12A, the delay unit 400 includes a delay register 410 and a resynchronizer 420. In an example embodiment, the delay unit 400 includes only the delay register 410. In another example embodiment, the delay unit 400 includes the delay register 410 and the resynchronizer 420.

As will be described with reference to FIG. 12B, the delay register 410 delays the modulation signal MS to generate N control signals MC1~MCN. The N control signals MC1~MCN have different delay times with respect to one another. The N control signals MC1~MCN are applied to the modulus dividers 200 or 215 of the frequency divider 350 of FIG. 11. The control signals MC1~MCN applied to the modulus dividers 200 go through the multiple phase detector 310 and the multiple charge pump 320. Therefore high frequency components of the modulation signal MS are reduced because high frequency components of a quantization noise (that results from sigma-delta modulation) included the modulation signal MS are averaged while the control signals MC1~MCN applied to the modulus dividers 200 or 215 go through the multiple phase detector 310 and the multiple charge pump 320. The delay register 410 may include a plurality of delay cells coupled in series or in parallel.

Figure 12B:
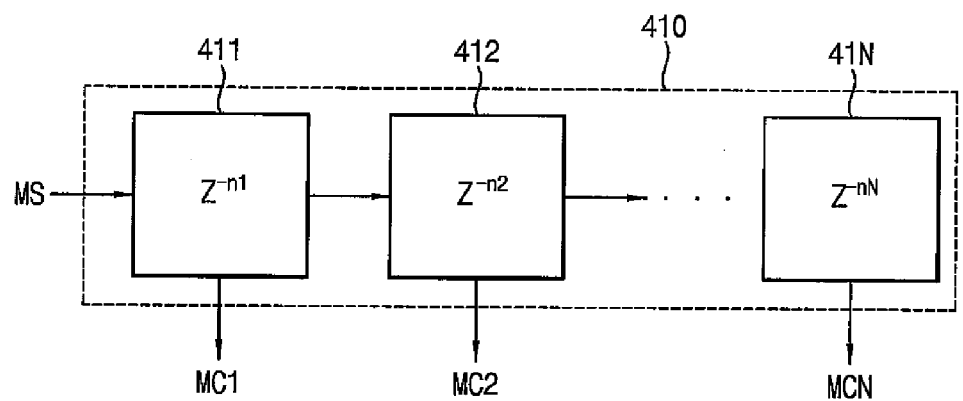
FIG. 12B is a block diagram further illustrating the delay register of FIG. 12A.

FIG. 12B is a block diagram further illustrating the delay register of FIG. 12A.

Referring to FIG. 12B, the delay cell 410 include a plurality of delay cells 411, 412, . . . , 41N that are coupled in series. The delay cell 411 receives the modulation signal MS, and delays the modulation signal MS. The delay cells 411, 412, . . . , 41N that are coupled in series and delays respective inputs. The delay cells 411, 412, . . . , 41N respectively provide the control signals MC1, MV2, . . . , MCN to the frequency divider 350. Therefore, the high frequency components of a quantization noise (that results from sigma-delta modulation) included the modulation signal MS are averaged while the control signals MC1~MCN go through the PLL 305. That is, the delay register 410 lowers the level of quantization noise.

When the delay unit 400 further includes the resynchronizer 420, the resynchronizer 420 resynchronizes outputs of the delay register 410 to provide the control signals MC1~MCN. In an example embodiment as illustrated in FIG.

12B, the delay register 410 includes series coupled delay cells 411, 412, ..., 41N. In another example embodiment, the delay register 410 includes similar delay cells coupled in parallel.

Figure 13:
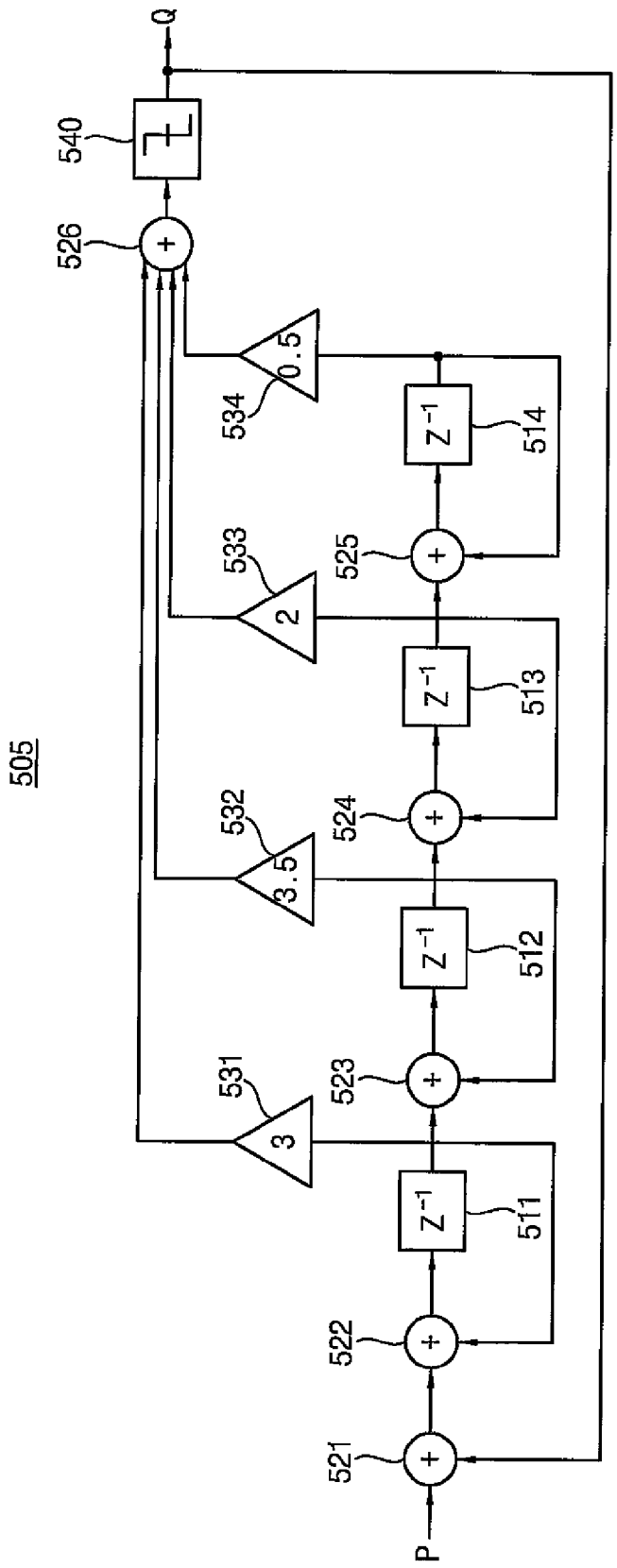
FIG. 13 illustrates a fourth-order sigma-delta modulator that may be employed by the sigma-delta modulator of FIG. 11 according to an example embodiment.

FIG. 13 illustrates a fourth-order sigma-delta modulator that may be employed by the sigma-delta modulator of FIG. 11 according to an example embodiment.

Referring to FIG. 13, a fourth-order sigma-delta modulator 505 including delayers 511, 512, 513, and 514, adders 521, 522, 523, 524, 525, and 526, feedback coefficient multipliers 531, 532, 533, and 534 and a quantizer 540. When input data includes 20 bits, the fourth-order sigma-delta modulator 505 may provide output of 7 levels.

Figure 14:
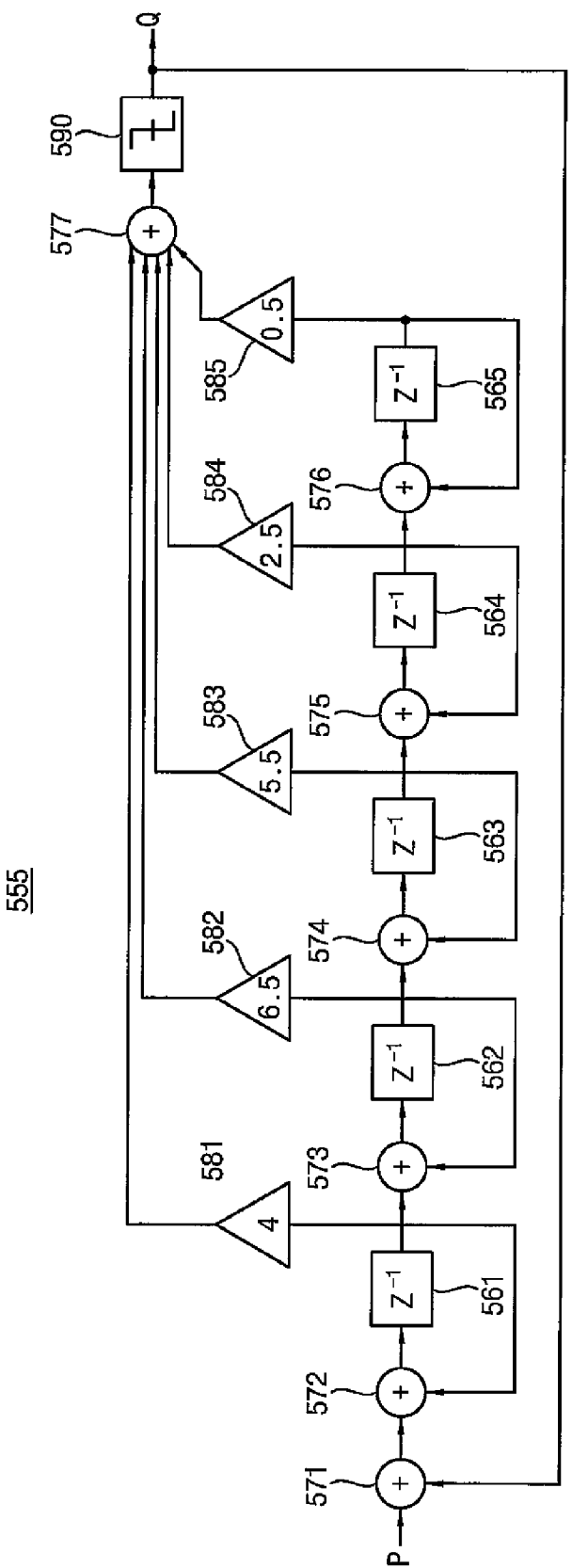
FIG. 14 illustrates a fifth-order sigma-delta modulator that may be employed by the sigma-delta modulator of FIG. 11 according to another example embodiment.

FIG. 14 illustrates a fifth-order sigma-delta modulator that may be employed by the sigma-delta modulator of FIG. 11 according to another example embodiment.

Referring to FIG. 14, a fifth-order sigma-delta modulator 555 includes delayers 561, 562, 563, 564, and 565, adders 571, 572, 573, 574, 575, 576, and 577 feedback coefficient multipliers 581, 582, 583, 584, 585 and a quantizer 590. When input data includes 20 bits, the fifth-order sigma-delta modulator 555 may provide output of 20 levels.

Although not illustrated, one tap of digital FIR filter $(1+z^{-1})$ may be coupled to the output of the sigma-delta modulator of FIGS. 13 and 14 for comparing performance. When fourth-order or fifth-order sigma-delta modulator is employed, the quantization noise may be shifted from lower frequency area to higher frequency area, and thus noise characteristic may be enhanced.

Figure 15:
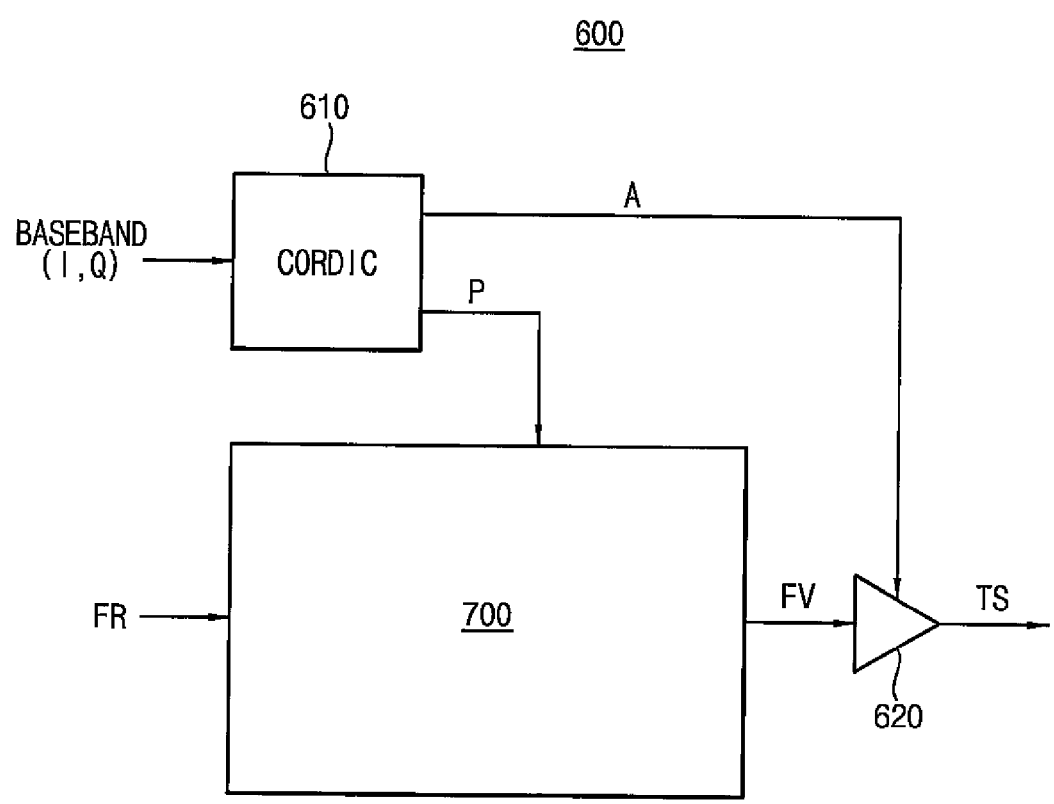
FIG. 15 is a block diagram illustrating an application circuit that may employ a frequency synthesizer according to an example embodiment.

FIG. 15 is a block diagram illustrating an application circuit incorporating a frequency synthesizer according to an example embodiment.

Referring to FIG. 15, an application circuit 600 generally includes a data processing unit 610, a frequency synthesizer 700 and a power amplifier 620.

The data processing unit 610 processes baseband data BASEBAND including an in-phase signal I and a quadrature signal Q to convert the processed baseband data BASEBAND to an amplitude signal A and a phase signal P. The frequency synthesizer 700 generates an oscillation frequency signal FV based on a reference frequency signal FR and the phase signal P. The power amplifier 620 synthesizes the oscillation frequency signal FV and the amplitude signal A to output a transmission signal TS.

The data processing unit 610 may be implemented with a Coordinate Rotational Digital Computer (CORDIC), and the data processing unit 610 converts the baseband data BASEBAND represented as coordinate components on the I-signal axis and the Q-signal axis to the amplitude component, i.e., the amplitude signal A and the phase component, i.e., the phase signal P. The frequency synthesizer 700 generates the oscillation frequency signal FV based on the phase signal P. The power amplifier 620 receives the oscillation frequency signal FV and provides the transmission signal TS having output levels according to the amplitude signal A.

The application circuit 600 of FIG. 15 may employ the frequency synthesizer 300 of FIG. 11. When the frequency synthesizer 300 of FIG. 11 is employed by the application circuit 600 of FIG. 15, the application circuit 600 of FIG. 15 may be a polar transmitter.

Figure 16:
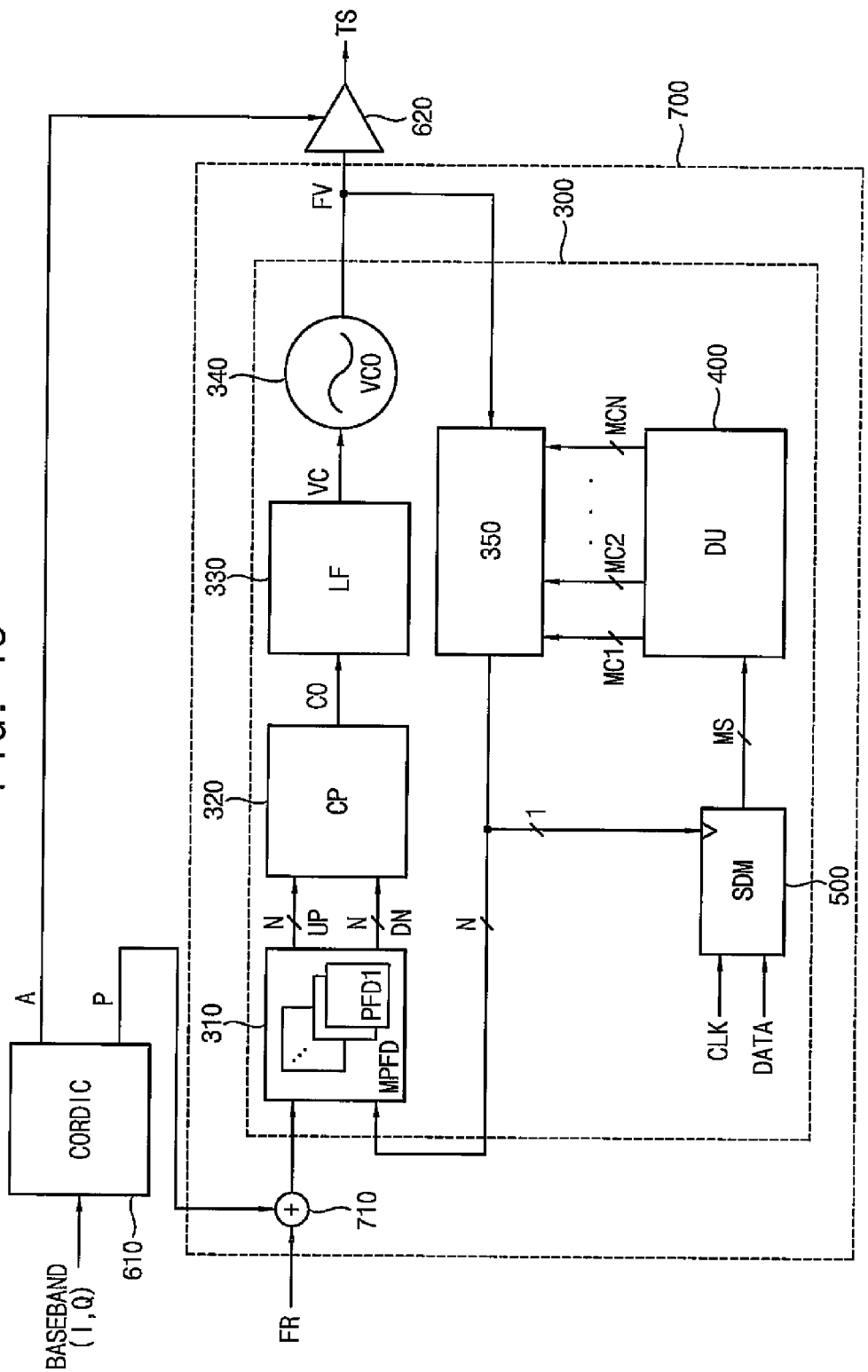
FIG. 16 illustrates a polar transmitter including the frequency synthesizer of FIG. 11 according to an example embodiment.

FIG. 16 illustrates a polar transmitter incorporating the frequency synthesizer of FIG. 11 according to an example embodiment.

Referring to FIG. 16, a polar transmitter includes the data processing unit 610, the power amplifier 620, and the frequency synthesizer 300 of FIG. 11 and an adder 710.

The frequency synthesizer 300 includes the multiple phase detector 310, the multiple charge pump 320, the loop filter 330, the VCO 340, the frequency divider 350, the delay unit 350, and the sigma-delta modulator 500.

The adder 710 sums the reference frequency signal FR and the phase signal P from the data processing unit 610, and provides the summed signal to the multiple phase detector 310.

Generally, in polar modulation, when baseband bandwidth is greater than the loop bandwidth of a PLL, certain signal components belonging to the area exceeding the loop bandwidth are lost. However, when the PLL loop bandwidth is broadened to prevent component loss, sigma-delta noise increases, and thus, the transmission signal includes more noise components.

Against this conventional tradeoff, the application circuit 600 of FIG. 15 and the polar transmitter of FIG. 16 incorporating the frequency synthesizer 300 may reduce sigma-delta noise by adopting the delay unit 400 having delay register 410 of FIG. 12B and frequency divider having one prescaler and the plurality of modulus dividers commonly coupled to the one prescaler. Therefore, the transmission signal TS may be generated without component loss by broadening the PLL loop bandwidth when the baseband bandwidth is relatively broad, such as in WCDMA.

The polar transmitter of FIG. 16 is just one example embodiment of the application circuit of FIG. 15, and the application circuit is not limited to the example embodiment.

As mentioned above, frequency synthesizing is performed by using a frequency divider including one prescaler that operates with a fixed high frequency, and a plurality of modulus dividers commonly coupled to the one prescaler and operating with variable low frequencies, and thus the power consumption and the circuit size may be reduced. In addition, the quantization noise is reduced by using the delay register, and thus the loop bandwidth may be widened without increasing phase noise due to the sigma-delta modulation. Therefore, the example embodiments may be applicable to a field where wide bandwidth of the baseband data is required, when the example embodiments are used in a direct phase modulation.

The foregoing is illustrative of the present invention and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A frequency divider comprising:
a prescaler configured to generate a plurality of intermediate frequency signals having a same phase difference with respect to one another in response to an oscillation frequency signal, the prescaler operating at a first frequency, wherein the prescaler comprises:
a first divider configured to divide the oscillation frequency signal with a fixed first frequency ratio to provide a first plurality of frequency signals having a same phase difference with respect to one another;

a logic level converter configured to convert logic levels of the first plurality of frequency signals from a first level to a second level and thereby provide a second plurality of frequency signals having a same phase difference with respect to one another; and an overlap prevention circuit configured to prevent overlap of adjacent frequency signals in the plurality of second frequency signals and provide the plurality of intermediate frequency signals; and a plurality of modulus dividers commonly coupled to the prescaler and configured to respectively divide the plurality of intermediate frequency signals by respective ratios to provide a plurality of division frequency signals in response to a control signal, the plurality of modulus dividers operating at a second frequency less than the first frequency.

2. The frequency divider of claim 1, wherein the first level corresponds to current-mode logic level, and the second level corresponds to CMOS logic level.

3. The frequency divider of claim 1, wherein the overlap prevention circuit comprises:
a delay cell configured to delay a leading frequency signal of the adjacent frequency signals; and
a logic gate configured to perform an AND operation on an inverted version of the leading frequency signal and a lagging frequency signal of the adjacent frequency signals.

4. The frequency divider of claim 1, wherein each of the modulus dividers comprises:
a phase shifter configured to select one of the plurality of intermediate frequency signals and provide a first clock signal in response to a plurality of phase control bits of the control signal; and
a programmable counter configured to divide the first clock signal by a division ratio among a first division range to provide the plurality of division frequency signals in response to a plurality of modulus control bits of the control signal.

5. The frequency divider of claim 4, wherein the phase shifter comprises:
a first selector configured to select one of the plurality of intermediate frequency signals to provide the first clock signal in response to a control word;
a second selector configured to select one of the plurality of intermediate frequency signals to provide a second clock signal leading the first clock signal by 90 degree in phase, in response to the control word;
a first register configured to load the control word in synchronization with the first clock signal;
a second register configured to buffer the loaded control word in synchronization with the first second signal; and
a logic gate configured to determine inputs of the phase control bits as the control word to the first register according to logic level of an enable signal provided from the programmable counter.

6. The frequency divider of claim 5, wherein the programmable counter comprises:
a plurality of second dividers cascaded, coupled, and configured to divide input clock signals including the first clock signal respectively with one of second and third division ratios in response to each of the modulus control bits, the enable signal being enabled once during one cycle of one of the plurality of division frequency signals.

7. The frequency divider of claim 6, wherein each of the second dividers divides the input clock signal with the second division ratio when each of the modulus bits corresponds to first logic level, and each of the second dividers divides the input clock signal with the third division ratio when each of the modulus bits corresponds to the second level.

8. The frequency divider of claim 6, wherein each one of the plurality of modulus dividers comprises:
a phase selection unit configured to select one of the plurality of intermediate frequency signals to provide a selection frequency signal in response to a phase control signal;
a first divider configured to divide the selection frequency signal with a fixed first division ratio to provide a divided selection frequency signal;
a counting unit configured to count the divided selection frequency signal to provide the division frequency signal and divide a counting interval of the divided selection frequency signal to provide a modulus control signal; and
a logic gate configured to provide the phase control signal in response to the modulus control signal and the divided selection frequency signal.

9. The frequency divider of claim 8, wherein the phase selection unit comprises:
a phase controller configured to provide a frequency control signal in response to the phase selection signal; and
a phase switch configured to switch and select one of the plurality of intermediate frequency signals in response to the frequency selection signal.

10. The frequency divider of claim 8, wherein the counting unit comprises:
a main counter configured to count the divided selection frequency signal to provide a counting result as the division frequency signal in response to the control signal; and
a swallow counter configured to divide a counting interval of the divided selection frequency signal and count the counting interval with different counting coefficients to provide the modulus control signal, the swallow counter being reset by the division frequency signal.

11. A frequency synthesizer comprising:
a phase-locked loop (PLL) configured to provide an oscillation frequency signal in response to a reference frequency signal and each of plurality of division frequency signals, wherein the PLL comprises a frequency divider having a prescaler, and a plurality of modulus dividers commonly coupled to the prescaler and configured to provide the plurality of division frequency signals;
a sigma-delta modulator configured to operate in synchronization with one of the plurality of division frequency signals, and sigma-delta modulate a clock signal and data to provide a modulation signal; and
a delay unit configured to delay the modulation signal to provide control signals to the PLL, wherein the delay unit comprises:
a delay register configured to delay the modulation signal and reduce quantization noise in the modulation signal; and
a resynchronizer configured to resynchronize the output of the delay register to provide the control signals.

12. The frequency synthesizer of claim 11, wherein the sigma-delta modulator is a fourth order sigma-delta modulator or a fifth order sigma-delta modulator.

* * * * *